United States Patent

Ganser

[15] 3,650,826

[45] Mar. 21, 1972

[54] METHOD FOR PRODUCING METAL CONTACTS FOR MOUNTING SEMICONDUCTOR COMPONENTS IN HOUSINGS

[72] Inventor: Wolfgang Ganser, Munich, Germany

[73] Assignee: Siemens Aktiengesellschaft, Berlin, Munich, Germany

[22] Filed: Sept. 26, 1969

[21] Appl. No.: 861,355

[30] Foreign Application Priority Data

Sept. 30, 1968 Germany ......................P 17 89 062.9

[52] U.S. Cl. ..............................117/217, 117/107, 117/119, 29/197, 29/198, 29/199, 204/14, 317/234 M, 317/234 L

[51] Int. Cl. ........................................C23b 5/50, C23c 1/08

[58] Field of Search ..................317/234 M, 234 L; 117/217, 117/107, 119; 204/14; 29/197, 198, 199

[56] References Cited

UNITED STATES PATENTS

| | | | |
|---|---|---|---|
| 3,523,223 | 8/1970 | Luxem et al | 317/234 M |
| 3,465,209 | 9/1969 | Denning et al | 317/DIG. 12 |
| 3,429,029 | 2/1969 | Langdon et al | 317/234 M |
| 3,270,256 | 8/1966 | Mills et al | 317/234 M |

*Primary Examiner*—Alfred L. Leavitt
*Assistant Examiner*—M. F. Esposito
*Attorney*—Curt M. Avery, Arthur E. Wilfond, Herbert L. Lerner and Daniel J. Tick

[57] ABSTRACT

A method for producing metal contact layers for mounting semiconductor components in a housing, particularly those made by the planar technique. The semiconductor component surface to be contacted with the housing is first provided with a layer consisting of aluminum and nickel. Thereafter, a metal layer consisting of titanium is deposited on top of the alloy layer and subsequently thickened by a coating of silver.

8 Claims, 2 Drawing Figures

METHOD FOR PRODUCING METAL CONTACTS FOR MOUNTING SEMICONDUCTOR COMPONENTS IN HOUSINGS

My invention relates to a method for producing metal contact layers to be used for mounting in a housing semiconductor components, particularly those made by the planar technique.

When mounting planar diodes in a housing, consisting preferably of glass, the mechanical stability of the component in the housing is of considerable importance. Such mechanical stability, which is a prerequisite for attaining good electrical parameters of the component, is predicated upon the presence of good solderable contacts. There must furthermore exist a good and fast adhering connection of these contacts with the semiconductor material.

It is an object of the invention to produce good solderable contacts on semiconductor components to be mounted in miniature glass housings and to provide such contacts with a good and fast adhesion on semiconductor materials, particularly high ohmic silicon.

To this end, and according to my invention, I deposit an alloy consisting of aluminum and nickel upon the semiconductor component surface to be contacted with the housing. I further precipitated a titanium metal layer upon the alloy layer and subsequently thicken the titanium metal layer by a coating of silver.

According to a more specific feature of my invention, I prefer depositing as the first layer an aluminum-nickel alloy with a nickel content of 1 to 2 percent. According to another feature of my invention, it is preferable that the aluminum-nickel alloy layer be about 0.1 $\mu$ thick. According to a particularly favorable embodiment of the invention, the metal layer of titanium is precipitated in a thickness of 0.5 $\mu$ and the silver coating in a thickness of about 1 $\mu$.

It has been found particularly favorable to produce the metal layers by vaporization. This is preferably done by a vapor deposition process at a pressure below $10^{-5}$ Torr. Another way, equally well suitable, is to vapor-deposit the aluminum-nickel alloy and to deposit the titanium and/or the silver layer by galvanic precipitation.

The first deposited aluminum-nickel layer secures a good electrical contact with the semiconductor material, particularly silicon. The subsequently deposited titanium prevents the occurrence of an alloy of aluminum and silver similar to the "-purple pest" of aluminum-gold alloys. The last deposited silver layer affords a satisfactory soldering of the semiconductor component into the housing by means of the conventional solder wafers consisting of a copper core coated on both sides with a metal layer, consisting for example of antimony-doped gold with an addition of tin.

Figure 1:
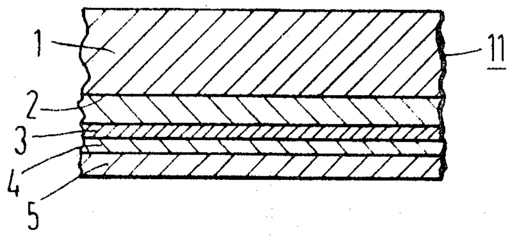
Figure 2:
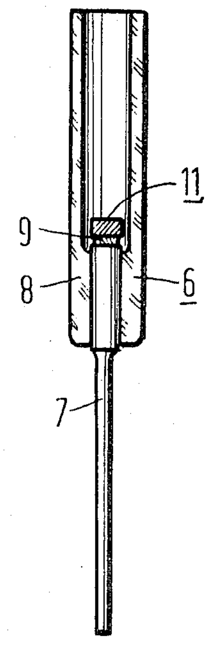

For further explaining the invention, reference will be made to an embodiment illustrated by way of example on the accompanying drawing, in which:

FIG. 1 shows partially a cross section through a semiconductor component made according to the invention, and FIG. 2 illustrates the same component as part of an assembly which comprises a housing.

Referring to FIG. 1, the illustrated component comprises a P-doped silicon monocrystalline wafer 1 ($\rho$ larger than 0.03 ohm·cm.) in which a PN junction 2 is produced by means of an N-dopant, for example phosphorus. The semiconductor crystalline wafer is first coated on its bottom side with an aluminum-nickel alloy composed of 98 percent aluminum and 2 percent nickel. The aluminum-nickel alloy is vaporized onto the silicon wafer until a 0.5 $\mu$ thick layer 3 forms. A 0.5 $\mu$ thick metal layer 4 of titanium is deposited upon the layer 3. A coating 5 of silver having a thickness of about 1 $\mu$ is vapor-deposited upon the titanium layer. The deposition from the vaporous phase is effected in the conventional manner by evaporating the corresponding metals or alloys from a tungsten helix at a pressure of $10^{-5}$ Torr.

In FIG. 2 the semiconductor component 11, thus provided with the vapor-deposited contact layers, is mounted in a housing portion 6 which in this embodiment is constituted of a lead-through conductor 7 of copper jacket wire which is fused into a tube 8 of lead glass. A disc 9 of solder is interposed between the semiconductor component 11 and the copper wire 7 for bonding the component to the wire.

The invention affords the possibility of economically and reliably mounting into a miniature housing of glass such semiconductor components as silicon diodes produced by the planar technique, particularly planar Zener diodes made of P-type silicon with a resistivity greater than 0.03 ohm·cm. By virtue of the invention, the electrical current outages occurring with the known methods, such such as with the use of a titanium-gold layer as a back side contact, could be prevented to a very large extent.

I claim:

1. A method for producing metal contact layers for mounting semiconductor components in a housing, which comprises providing the semiconductor component surface to be contacted with the housing with a first layer consisting of an aluminum nickel alloy with a nickel content of 1 -2 percent, thereafter depositing a metal layer consisting of titanium on top of the alloy layer and subsequently depositing a silver layer on the titanium layer.

2. The method of claim 1, wherein the aluminum-nickel alloy layer is about 0.5 $\mu$ thick.

3. The method of claim 2, wherein the titanium layer is about 0.5 $\mu$ thick.

4. The method of claim 3, wherein the silver coating is about 1 $\mu$ thick.

5. The method of claim 4, wherein the metal layers are deposited by vaporization.

6. The method of claim 5, wherein the vaporization process is at a pressure below $10^{-5}$ Torr.

7. The method of claim 6, wherein the aluminum-nickel alloy is metal deposited and the titanium or silver layer is deposited by a galvanic process.

8. The method of claim 7, which is applied to a planar Zener diode made of P-silicon with an electrical resistivity larger than 0.03 ohm·cm.

* * * * *